United States Patent
Koo et al.

(10) Patent No.: US 8,102,219 B2
(45) Date of Patent: Jan. 24, 2012

(54) ELECTROMAGNETIC BANDGAP STRUCTURE AND PRINTED CIRCUIT BOARD

(75) Inventors: Ja-Bu Koo, Suwon-si (KR); Mi-Ja Han, Jeonju-si (KR); Han Kim, Yongin-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 308 days.

(21) Appl. No.: 12/478,965

(22) Filed: Jun. 5, 2009

(65) Prior Publication Data

US 2010/0134200 A1   Jun. 3, 2010

(30) Foreign Application Priority Data

Nov. 28, 2008 (KR) .................. 10-2008-0119584

(51) Int. Cl.
*H04B 3/32* (2006.01)

(52) U.S. Cl. ........... 333/12; 333/167; 333/185; 333/202

(58) Field of Classification Search ............... 333/12, 333/167, 185, 202, 204, 235, 245–247
See application file for complete search history.

(56) References Cited

U.S. PATENT DOCUMENTS 7,136,029 B2 * 11/2006 Ramprasad et al. .......... 343/909

* cited by examiner

*Primary Examiner* — Robert Pascal
*Assistant Examiner* — Kimberly Glenn
(74) *Attorney, Agent, or Firm* — McDermott Will & Emery LLP

(57) ABSTRACT

An electromagnetic bandgap structure is disclosed. In accordance with an embodiment of the present invention, the electromagnetic bandgap structure can include a dielectric layer, a plurality of conductive plates, placed on a planar surface which is different from that of the dielectric layer, vias, of which each is connected to each of the conductive plates, respectively, and penetrates through the dielectric layer from one end part that is connected to the conductive plates, and a conductive trace, which connects the other end parts of the vias with each other such that all of the conductive plates are electrically connected.

6 Claims, 16 Drawing Sheets

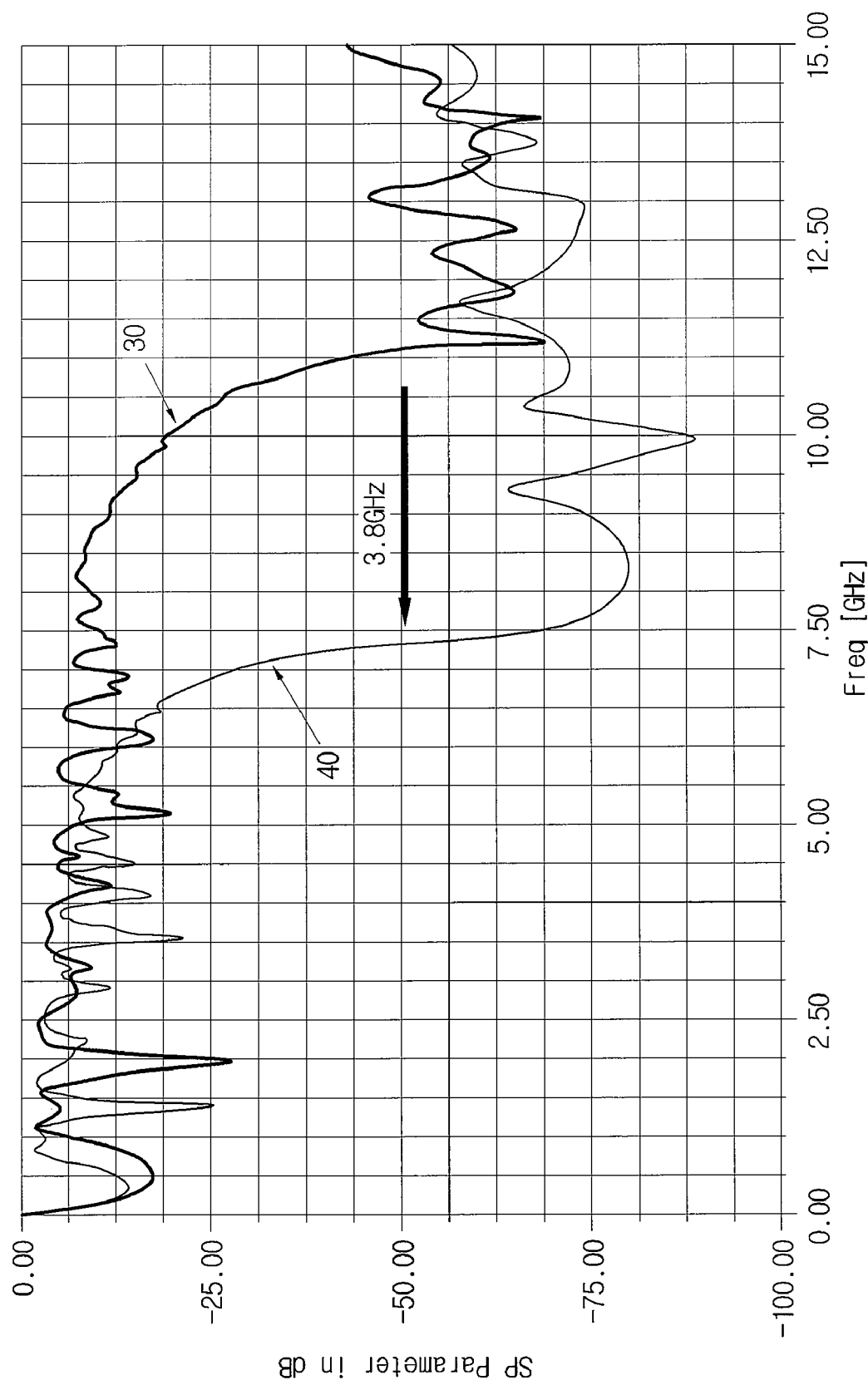

ELECTROMAGNETIC BANDGAP STRUCTURE AND PRINTED CIRCUIT BOARD

CROSS-REFERENCE TO RELATED APPLICATIONS

This application claims the benefit of Korean Patent Application No. 10-2008-0119584, filed with the Korean Intellectual Property Office on Nov. 28, 2008, the disclosure of which is incorporated herein by reference in its entirety.

BACKGROUND

1. Technical Field

The present invention relates to an electromagnetic bandgap structure, more specifically to an electromagnetic bandgap structure and a printed circuit board having the same that prevent a signal ranging a predetermined frequency band from being transmitted.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise problem, caused by the transfer of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be evident that the printed circuit board can be modified to have a 2, 6 or 8-layered structure.

As shown in FIG. 1, the printed circuit board 100 includes four metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). Here, it is assumed that the two electronic circuits 130 and 140 are digital circuits.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias. As an example, a via 160 electrically connects the metal layers of the reference numerals 110-1, 110-3, and 110-4 as shown in FIG. 1.

At this time, if the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

Accordingly, an electromagnetic bandgap structure (EBG) is recently receiving attention as a scheme to solve the aforementioned conductive noise. This is for the purpose of blocking a signal ranging a certain frequency band by arranging the EBG having a certain structure in a printed circuit board. However, the EBG structures according to the typical technology such as the MT-EBG and the PT-EBG have a limit to adjust each bandgap frequency band appropriate to the condition and feature required for various application products or to lower a conductive noise below the intended noise level within a pertinent bandgap frequency band.

Accordingly, the research for the EBG structure being extensively applied to various application products for which the required bandgap frequency bands separately differ, not to mention solving the aforementioned conductive noise problem, is urgently needed.

SUMMARY

Accordingly, the present invention provides an electromagnetic bandgap structure and a printed circuit board having the same that can block a conductive noise of a certain frequency band.

The present invention also provides a printed circuit board having the same that can solve a conductive noise problem through an electromagnetic bandgap structure having a certain structure in a printed circuit board without using a bypass capacitor or a decoupling capacitor.

In addition, the present provides an electromagnetic bandgap structure and a printed circuit board having the design flexibility and design freedom appropriate to the printed circuit board and being extensively applied to various application products (for example, an electronic apparatus (e.g. a mobile communication terminal) including an RF circuit and a digital circuit which are placed at the same board, SiP (System in Package), and network board, etc.) by the realization of various bandgap frequency band.

Other problems that the present invention solves will become more apparent through the following description.

An aspect of the present invention provides an electromagnetic bandgap structure that can block a noise of a certain frequency band.

In accordance with an embodiment of the present invention, an electromagnetic bandgap structure can include a dielectric layer, a plurality of conductive plates, which are placed on a planar surface which is different from that of the dielectric layer, vias, each of which is connected to each of the conductive plates, respectively, and penetrates through the dielectric layer from one end part that is connected to the conductive plates, and a conductive trace, which connects the other end parts of the vias with each other such that all of the conductive plates are electrically connected.

In an embodiment of the present invention, the other end part of the via that is connected to any one of the plurality of conductive plates can be electrically connected to the other end part of each of the vias connected to the conductive plates adjacently placed around any one of the conductive plates through the conductive trace.

In an embodiment of the present invention, the electromagnetic bandgap structure can further include a conductive layer, which is interposed between the conductive plates and the dielectric layer and in which the other end part of the via and the conductive trace are accommodated in a clearance hole formed in the conductive layer such that each of the conductive plates and the conductive layer can be electrically separated from each other.

In an embodiment of the present invention, the via can be formed at a position corresponding to a face-center of the conductive plate. In an embodiment of the present invention, the conductive trace can have a straight-line form or a line form broken one or more times.

Another aspect of the present invention provides a printed circuit board in which an electromagnetic bandgap structure is disposed in an area of a noise transferable path between a noise source point and a noise blocking destination point of the printed circuit board. In accordance with an embodiment of the present invention, the electromagnetic bandgap structure can include a dielectric layer, a plurality of conductive plates, placed on a planar surface which is different from that of the dielectric layer, vias, each of which is connected to each of the conductive plates and penetrates through the dielectric layer from one end part that is connected to the conductive plates, and a conductive trace, which connects the other end parts of the vias with each other such that all of the conductive plates are electrically connected.

In an embodiment of the present invention, the other end part of the via that is connected to any one of the plurality of conductive plates can be electrically connected to the other end part of each of the vias connected to the conductive plates adjacently placed around any one of the conductive plates through the conductive trace.

In an embodiment of the present invention, the electromagnetic bandgap structure can further include a conductive layer, which is interposed between the conductive plates and the dielectric layer and in which the other end part of the via and the conductive trace are accommodated in a clearance hole formed in the conductive layer such that each of the conductive plates and the conductive layer can be electrically separated from each other.

In an embodiment of the present invention, the via can be formed at a position corresponding to a face-center of the conductive plate. In an embodiment of the present invention, the conductive trace can have a straight-line form or a line form broken one or more times.

In an embodiment of the present invention, the conductive layer can be one of a ground layer and a power layer, and the conductive plates can be electrically connected to the other of the ground layer and the power layer.

In an embodiment of the present invention, the conductive layer can be a ground layer, and the conductive plates can be electrically connected to a signal layer.

In an embodiment of the present invention, two electronic circuits having different operation frequencies can be installed in the printed circuit board, and the noise source point and the noise blocking destination point can correspond to one position and the other position, respectively, in which the two electric circuits are to be installed.

Additional aspects and advantages of the present invention will be set forth in part in the description which follows, and in part will be obvious from the description, or may be learned by practice of the invention.

BRIEF DESCRIPTION OF THE DRAWINGS

FIG. 8 shows a comparison of the bandgap frequency properties of the electromagnetic bandgap structures shown in FIG. 2A and FIG. 4.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" are used only to distinguish one element from the other.

Hereinafter, some examples of an electromagnetic bandgap structure including a stitching via having a basic principle similar to an blocking noise principle in accordance with some embodiments of the present invention will be described with reference to FIG. 2A through FIG. 2C for easy understanding of the present invention before an electromagnetic bandgap structure and a printed circuit board having the same are described with reference to FIG. 4 and FIG. 5.

Although a metal layer, a metal plate and a metal trace are used throughout the description of an electromagnetic bandgap structure of the present invention, it shall be evidently understood by any person of ordinary skill in the art that any other conductive layers, plates and traces can be substituted for the metal layer, the metal plate and the metal trace.

Figure 2A:
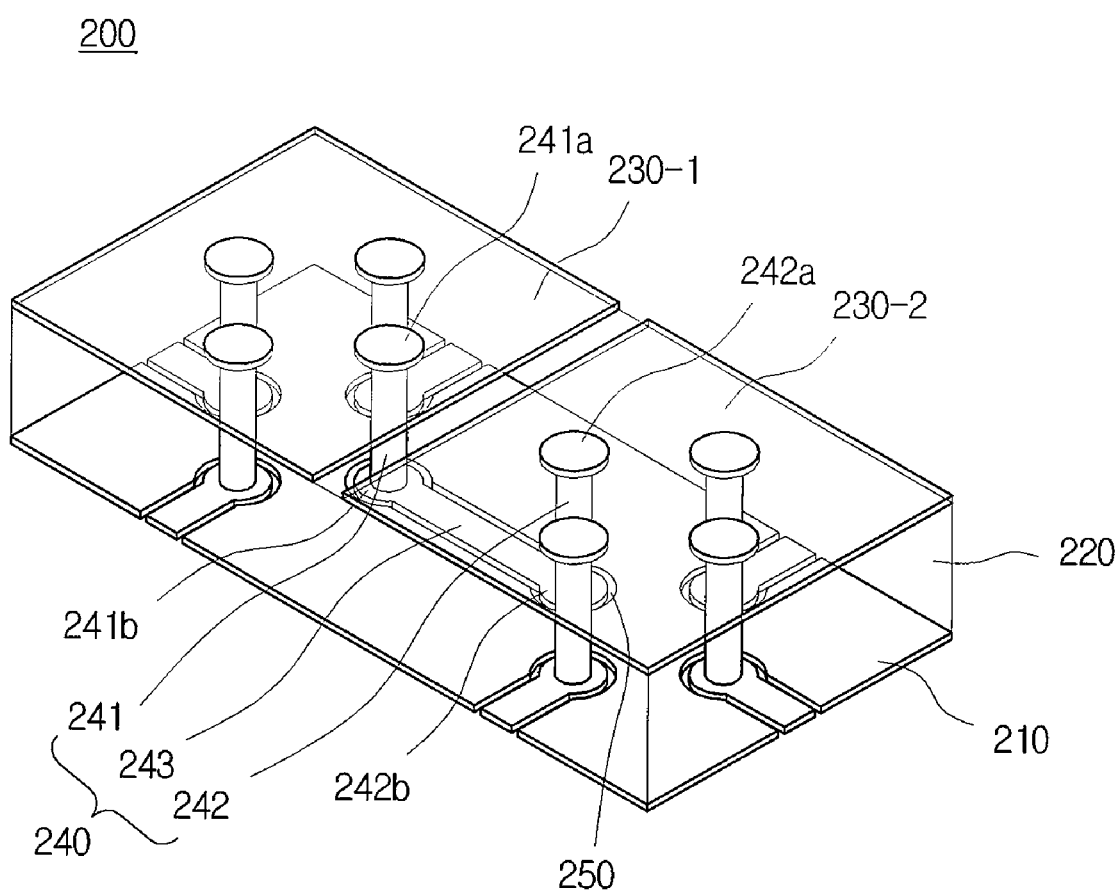
FIG. 2A is a 3-D perspective view showing an example of an electromagnetic bandgap structure including a stitching via as a comparison object of the present invention.
Figure 2B:
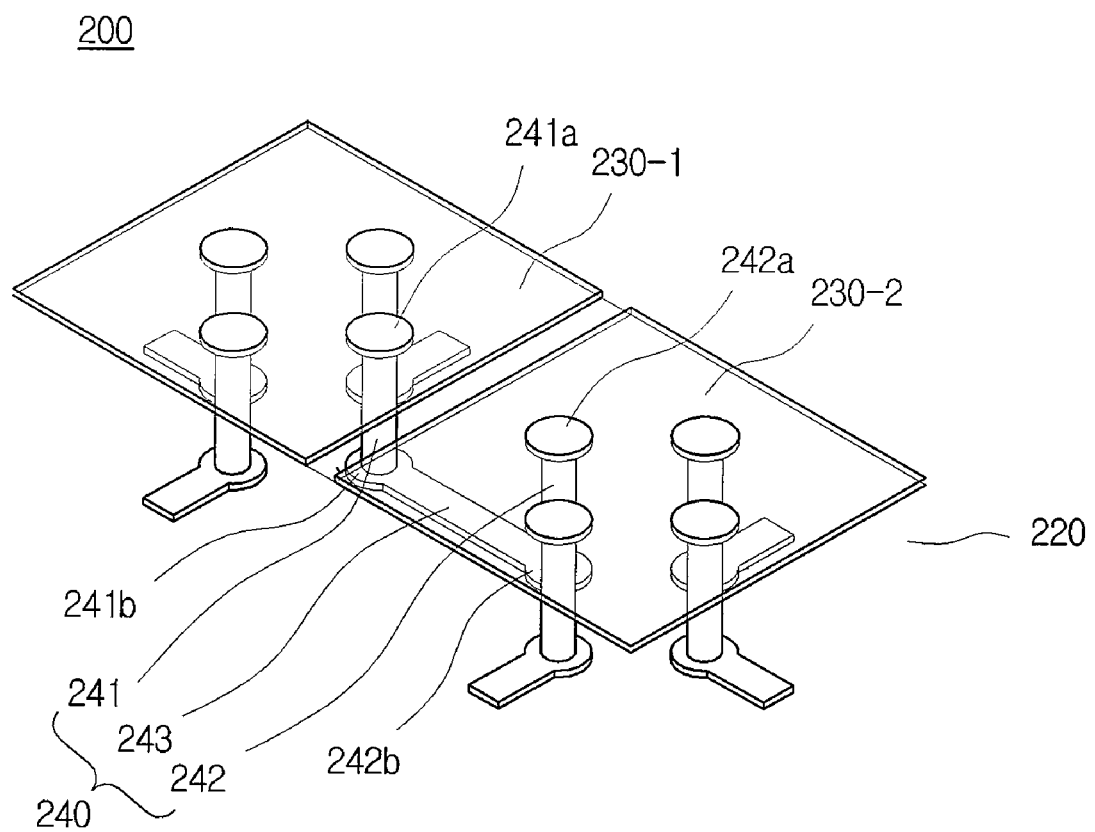
FIG. 2B is a 3-D perspective view showing another example of an electromagnetic bandgap structure including a stitching via as a comparison object of the present invention.
Figure 5:
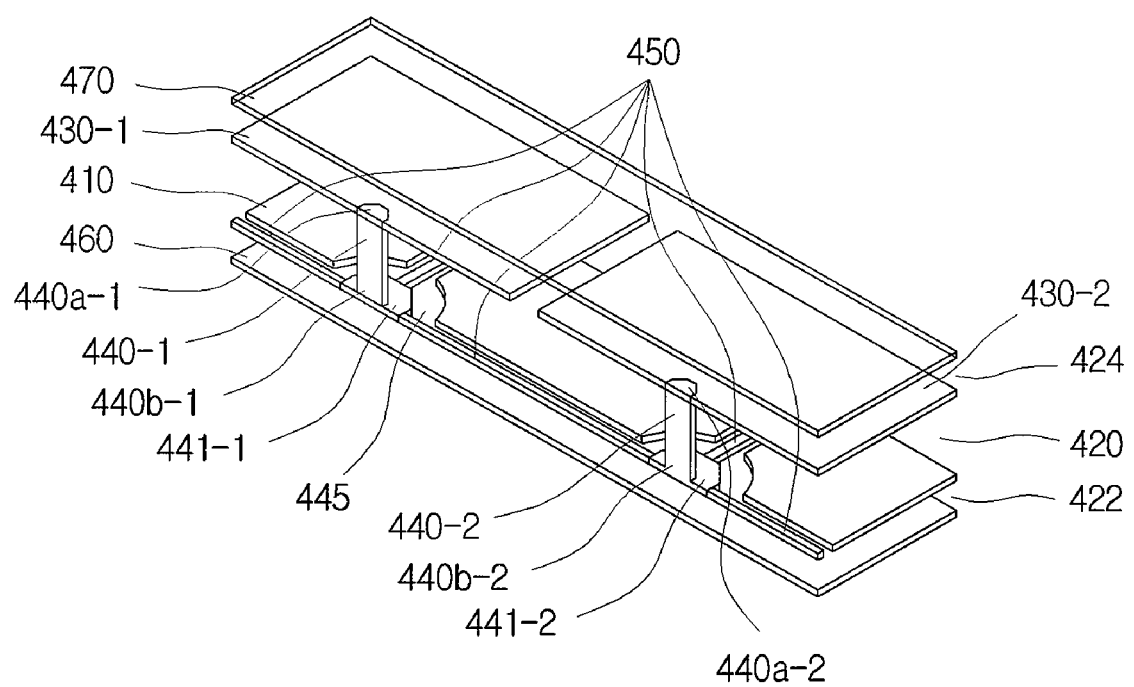
FIG. 5 is a 3-D sectional view showing the electromagnetic bandgap structure shown in FIG. 4.

Also, even though FIG. 2A, FIG. 2B and FIG. 5 show only two metal plates for the convenience of illustration, the electromagnetic bandgap structure can have a plurality of metal plates repeatedly arranged as its elements as shown in FIG. 3A through FIG. 3E.

An electromagnetic bandgap structure 200 shown in FIG. 2A can include a metal layer 210, a plurality of metal plates 230-1 and 230-2 (hereinafter, referred to as a first metal plate 230-1 and a second metal plate 230-2) spaced from the metal layer 410 and a stitching via 240. The electromagnetic bandgap structure 200 of FIG. 2A can have 2-layered planar structure including a first layer that can consist of the metal layer 210 and a second layer that can consist of the plurality of metal plates 230-1 and 230-2. A dielectric layer 220 can be interposed between the metal layer 410 and the plurality of metal plates 230-1 and 230-2.

Here, FIG. 2A shows only elements constituting the electromagnetic bandgap structure (i.e. the only part constituting the 2-layered electromagnetic bandgap including the stitching via) for the convenience of illustration. Accordingly, the first layer in which the first metal layer 210 shown in FIG. 2A is placed and the second layer in which the plurality of metal plates 230-1 and 230-2 shown in FIG. 2A are placed may be any two layers of a multi-layered printed circuit board. In other words, it shall be evident that there can be at least one additional metal layer below the metal layer 210, above the metal plates 230-1 and 230-2 and/or between the metal layer 210 and the metal plates 230-1 and 230-2. Similarly, this can be applied to the present invention shown in FIG. 4 and FIG. 5.

In addition, the electromagnetic bandgap structure 200 shown in FIG. 2A (the same can be applied to the present invention shown in FIG. 4 and FIG. 5) can be placed between any two metal layers separately constituting the power layer and the ground layer in a multi-layered printed circuit board in order to block the conductive noise. Since the conductive noise problem is not limited to the space between the power layer and the ground layer, the electromagnetic bandgap structure shown in FIG. 2A can be placed between any two ground layers or power layers placed on different layers from each other in a multi-layered printed circuit board.

Accordingly, the metal layer 210 may be any one metal layer for transferring an electric signal in a printed circuit board. The metal layer 210, for example, can be any metal layer functioning as the power layer or the ground layer, or any metal layer functioning as a signal layer constituting a signal line.

The metal layer 210 can be placed on a planar surface different from the planar surface in which the plurality of metal plates are placed and electrically separated from the plurality of metal plates. In other words, the metal layer 210 can form a layer that is different from the plurality of metal plates 230-1 and 230-2 with regard to electrical signals in the printed circuit board. For example, if the metal layer 210 is the power layer, the metal plates can be electrically connected to the ground layer. If the metal layer 210 is the ground layer, the metal plates can be electrically connected to the power layer. Alternatively, if the metal layer 210 is the signal layer, the metal plates can be electrically connected to the ground layer. If the metal layer 210 is the ground layer, the metal plates can be electrically connected to the signal layer. Similarly, this can be applied to FIG. 4 and FIG. 5.

The plurality of metal plates 230-1 and 230-2 can be placed on a planar surface above the metal layer 210. Any two metal plates can be electrically connected to each other through a stitching via. As such, each stitching via electrically connecting any two metal plates to each other can electrically connect every metal plate as one circuit.

Here, FIG. 2A shows the form (i.e. the form of FIG. 3A) that a metal plate and its adjacent metal plates can be electrically connected to each other through one stitching via each, and as a result, every metal plate can be electrically connected to each other. However, as long all metal plates can be formed as a closed loop by being electrically connected to each other, it can be possible to use any method of connecting the metal plates to each other through the stitching via.

Figure 3A:
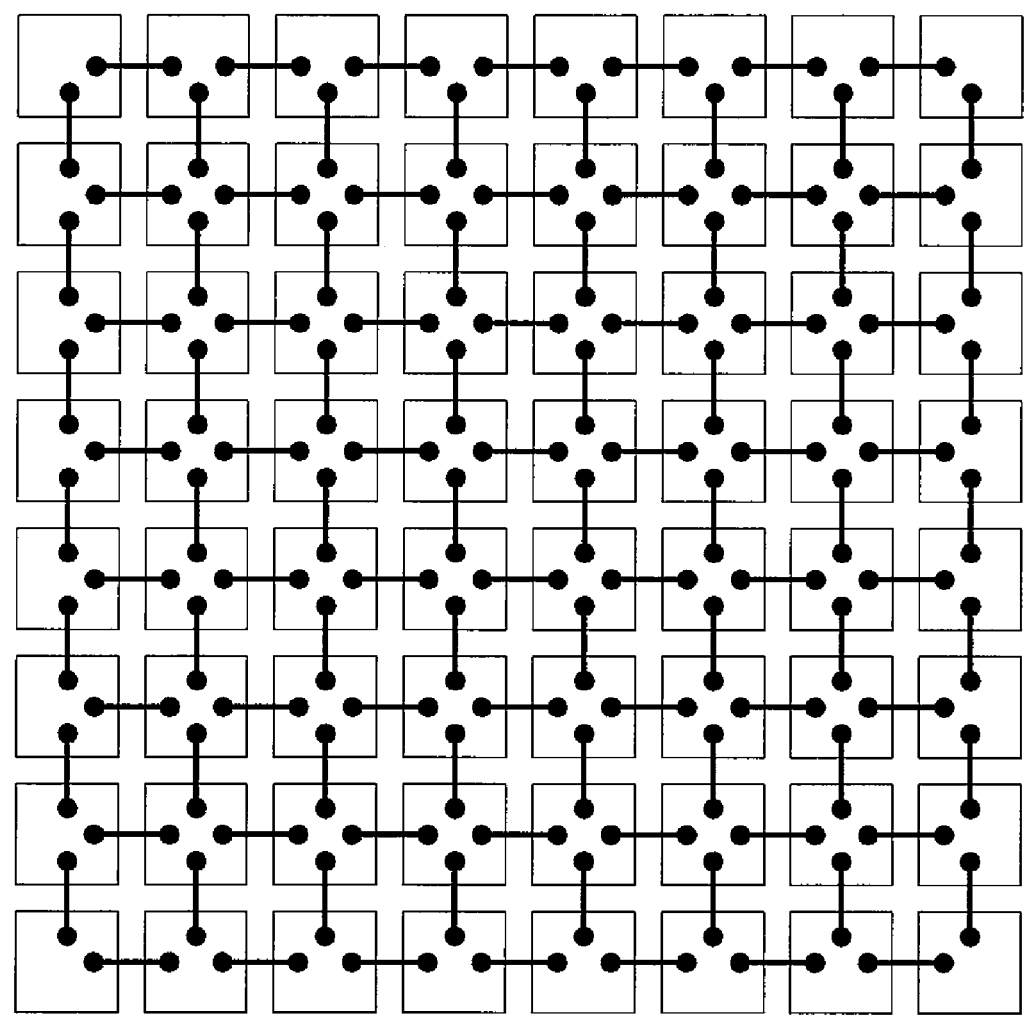
FIG. 3A is a plan view showing a configuration of an electromagnetic bandgap structure including a stitching via having a rectangular metal plate.
Figure 3B:
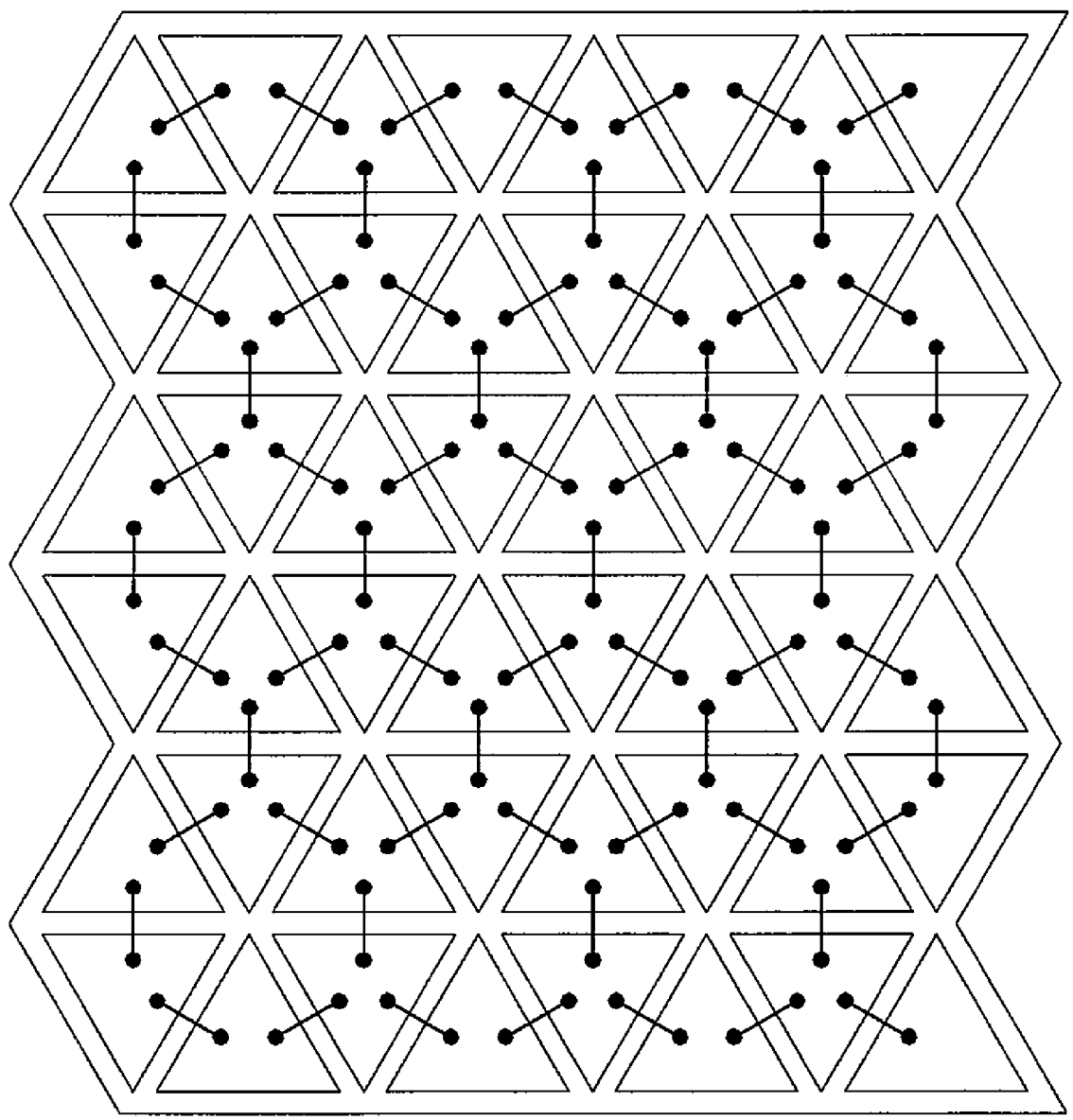
FIG. 3B is a plan view showing a configuration of an electromagnetic bandgap structure including a stitching via having a triangular metal plate.
Figure 3C:
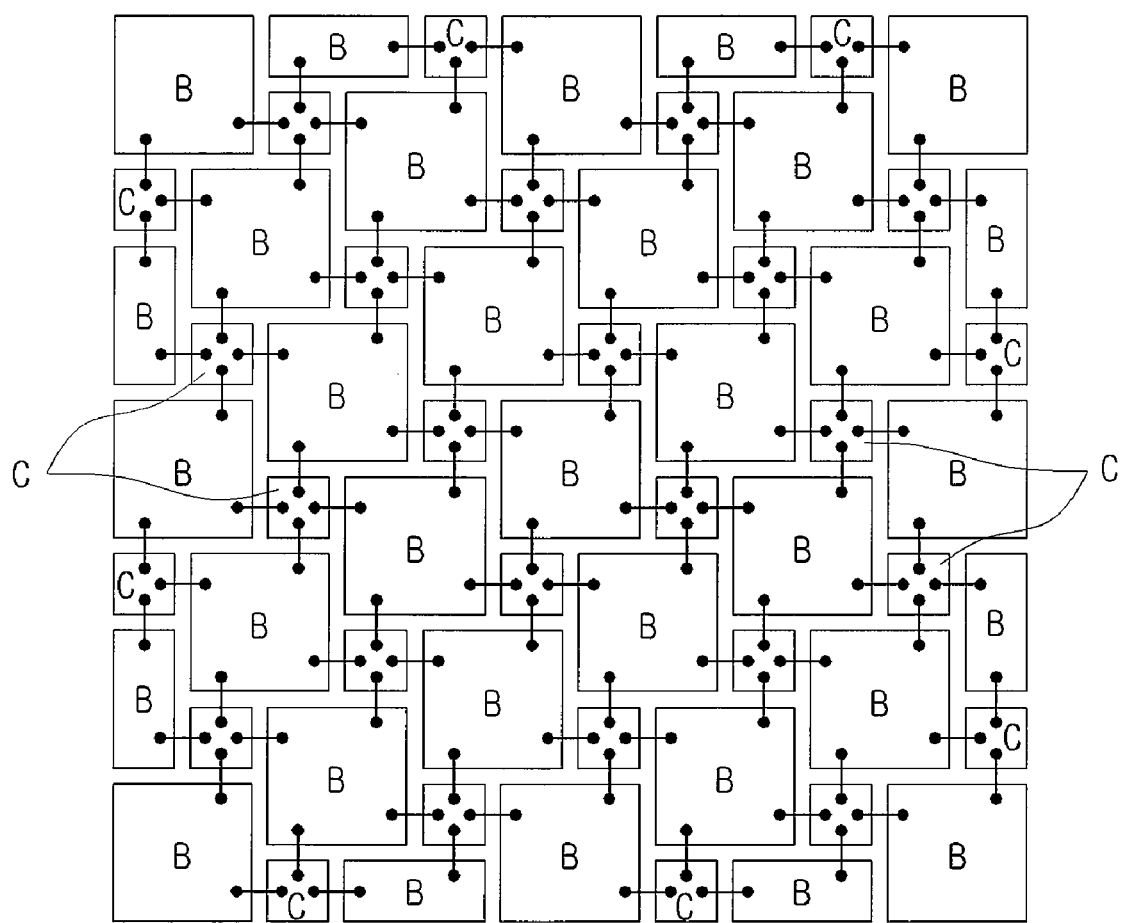
FIG. 3C and FIG. 3D are plan views showing a configuration of an electromagnetic bandgap structure including a stitching via consisting of a plurality of groups having different sized metal plates.
Figure 3D:
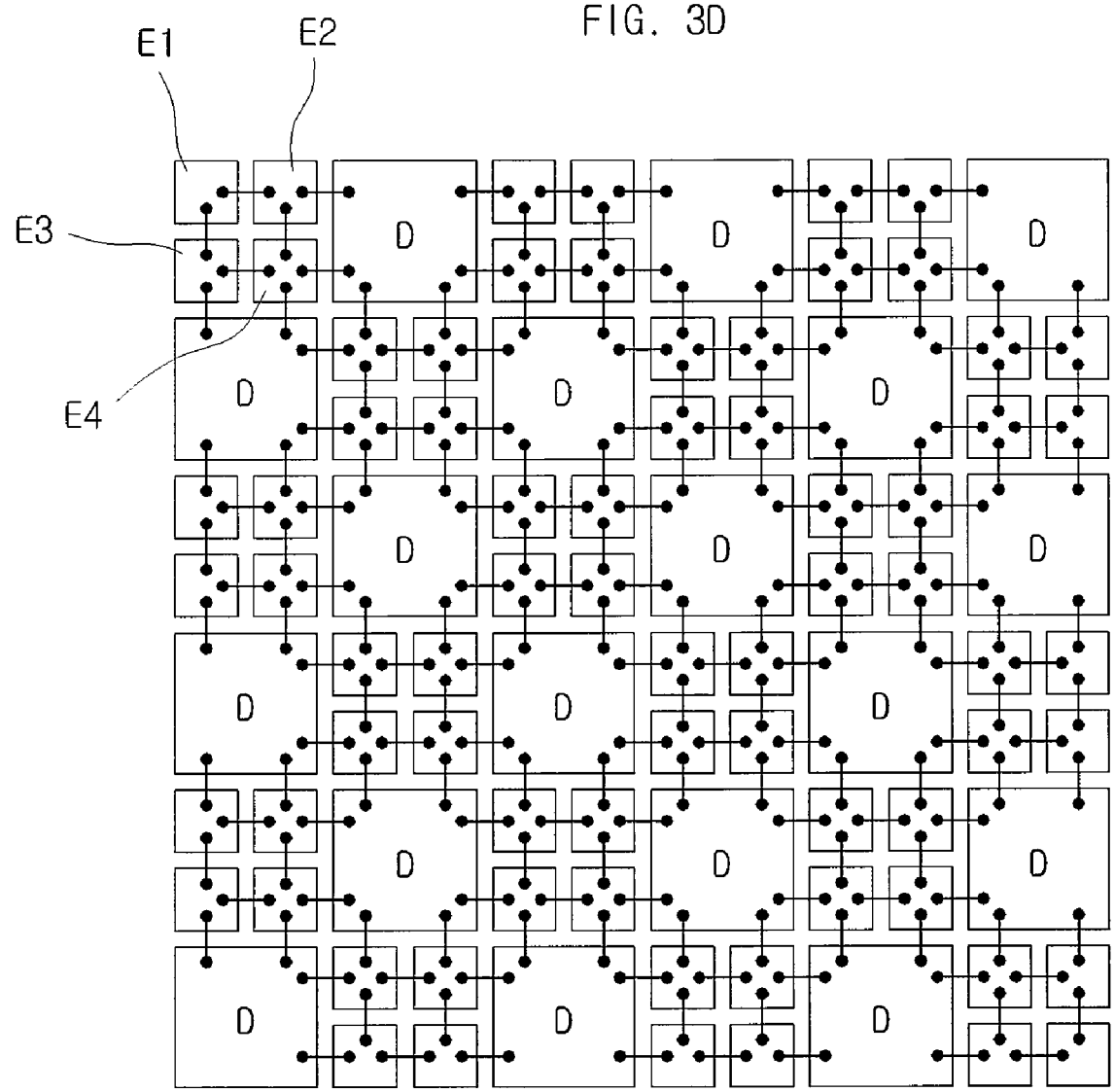
Figure 3E:
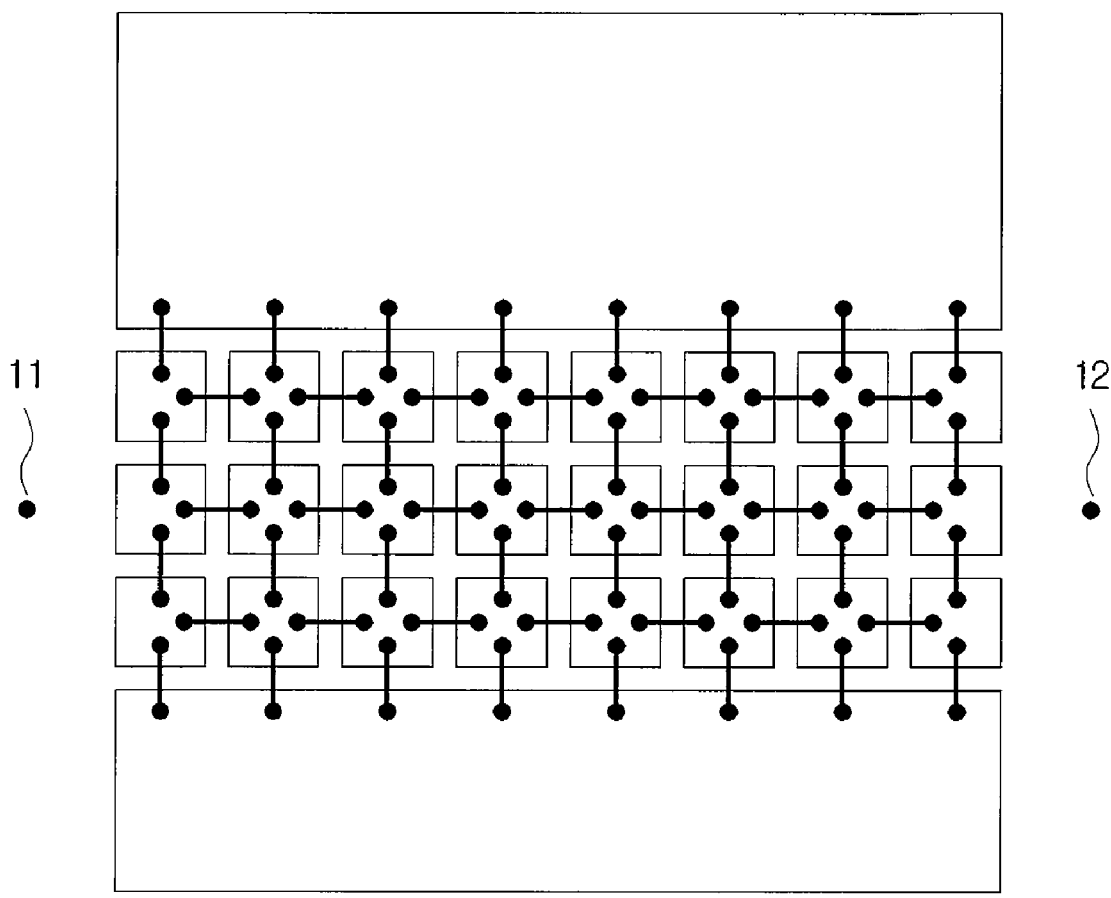
FIG. 3E is a plan view showing a band-shaped configuration of an electromagnetic bandgap structure including a stitching via.
Figure 4:
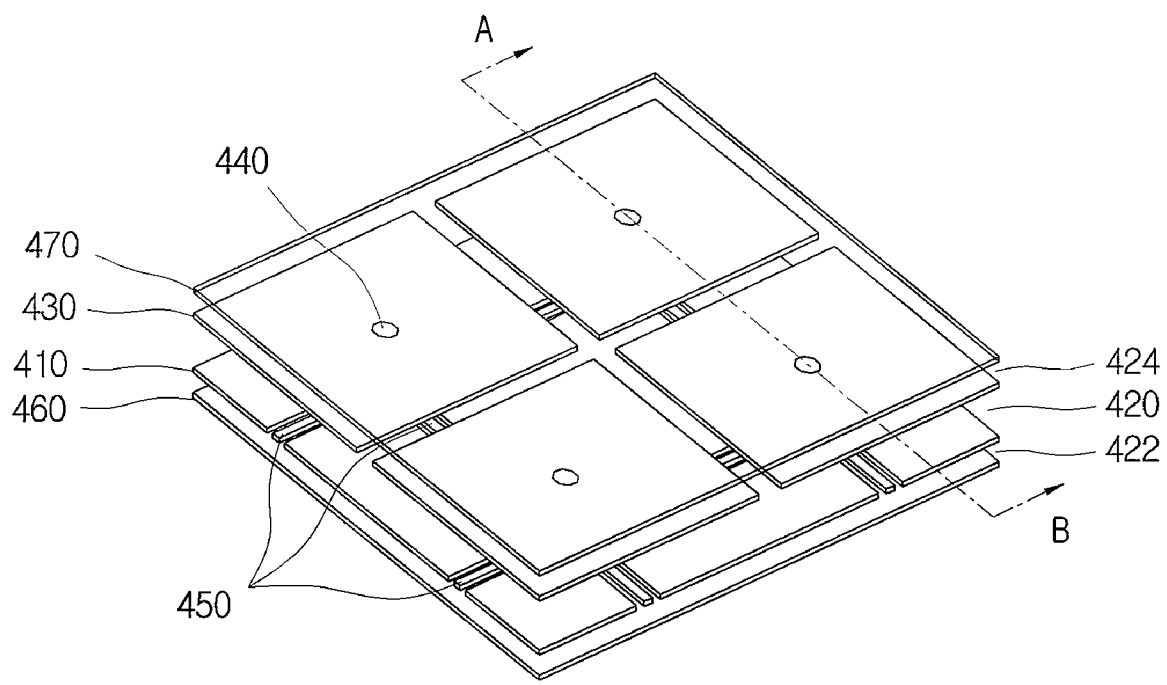
FIG. 4 is a 3-D perspective view showing an electromagnetic bandgap structure having a single-via structure in accordance with an embodiment of the present invention.

Also, even though FIG. 2A shows each of metal plates having a square shape of the same size for the convenience of illustration, various other modifications can be possible (the same can be applied to FIG. 2B, FIG.4 and FIG. 5). This will be briefly described with reference to FIG. 3A through FIG. 3E.

For example, the metal plates can have various polygonal shapes including not only a rectangle as shown in FIG. 3A, and a triangle as shown in FIG. 3B, but also a hexagon, an octagon, etc. Of course, the metal plate may not be limited to a certain shape such as a circle or an ellipse. Each of the metal plates can also have the same size (e.g. area and thickness) as shown in FIG. 3A, FIG. 3B and FIG. 3E. If the metal plates have different sizes, the metal plates can be distinguished and placed according to each of a plurality of groups having different sizes as shown in FIG. 3C or FIG. 3D.

In the case of FIG. 3C, metal plates B having a relatively bigger size and metal plates C having a relatively smaller size can be alternately arranged. In the case of FIG. 3D, metal plates D having a relatively bigger size and metal plates E1, E2, E3 and E4 having a relatively smaller size can be arranged. The small metal plates E1, E2, E3 and E4 can be grouped in a 2×2 form, and can occupy the area similar to the large metal plate D.

In addition, while the cells of the electromagnetic bandgap structures can be densely arranged on the whole part of an inner surface of the printed circuit board as shown in FIGS. 3A through 3D, the cells can be naturally arranged on some paths as shown in FIG. 3E. For example, as shown in FIG. 3E, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 3E, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Figure 1:
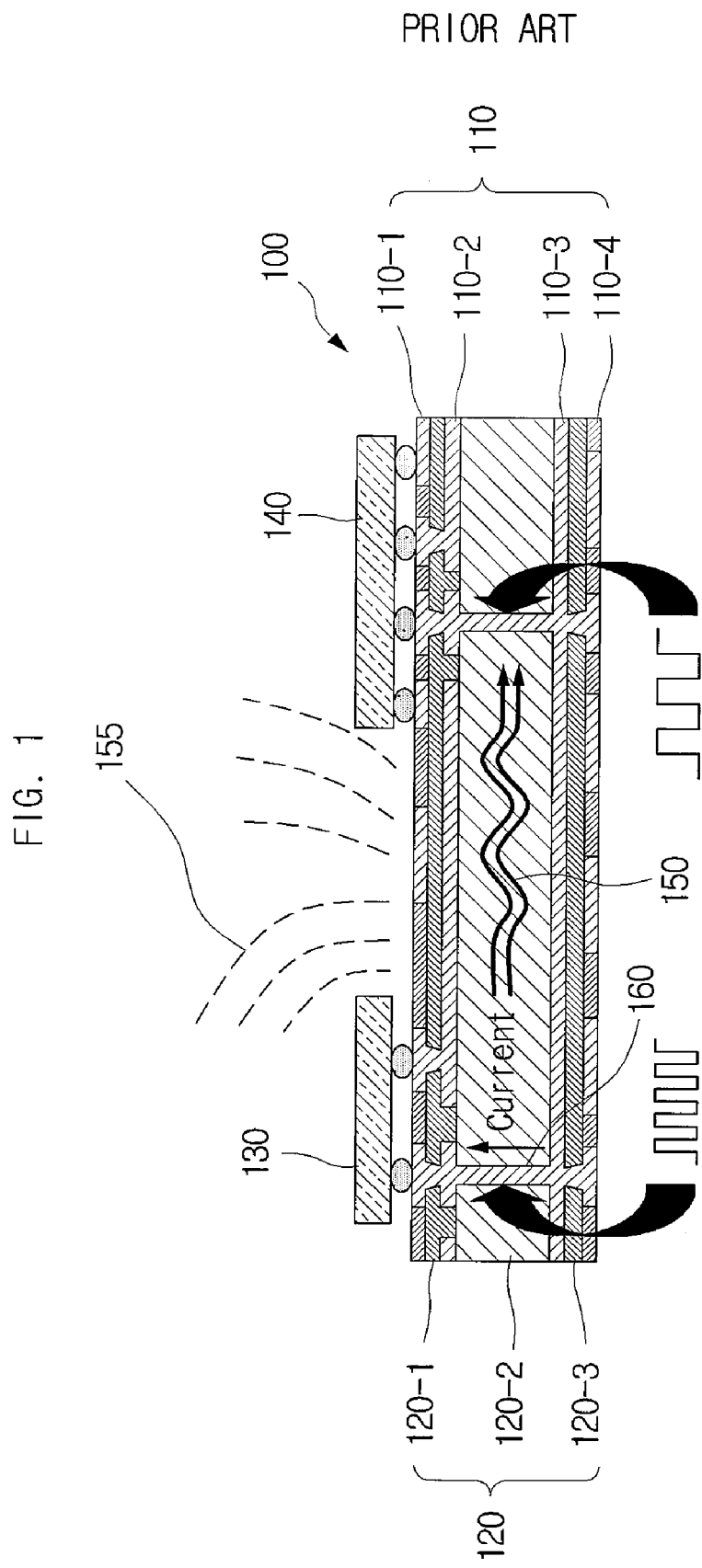
FIG. 1 is a cross-sectional view showing a printed circuit board including two electronic circuits having different operation frequencies.

Here, if it is assumed that any two electric circuits having different operation frequencies (refer to the first electric circuit 130 and the second electric circuit 140 in FIG. 1, described above) are implemented in the printed circuit board, the noise resource point and the noise blocking destination point can correspond to each position in which the two electric circuits will be implemented.

A stitching via can electrically connect any two metal plates of a plurality of metal plates to each other. All accompanying drawings of this specification show that the stitching via electrically connects two adjacent metal plates to each other. However, it may be unnecessary that any two metal plates connected by the stitching via are adjacent to each other. Also, even though it is shown that one metal plate is connected to another metal plate by one stitching via, it is evidently unnecessary that the electromagnetic bandgap structure has any limitation to the number of the stitching vias connecting any two metal plates. However, all below descriptions focus on the case that two adjacent metal plates are connected to each other by one stitching via.

The stitching via 240 can be formed to include a first via 241, a second via 242 and a connection pattern 243 in order to electrically connect two adjacent metal plates.

Herein, the first via 241 can be formed to start from one end part 241a connected to the first metal plate 230-1 and penetrate the dielectric layer 220, and the second via 242 can be formed to start from one end part 242a connected to the second metal plate 230-2 and penetrate the dielectric layer 220. The connection pattern 243 can be placed on the same planar surface as the metal layer 210 and have one end part, connected to the other end part 241b of the first via 241, and the other end part, connected to the other end part 242b of the second via 242. At this time, it is evident that a via land having a larger size than the via can be formed at one end part and the other end part of each via in order to reduce a position error of a drilling process for forming the via. Accordingly, the pertinent detailed description will be omitted.

At this time, a clearance hole 250 can be formed at an edge of the connection pattern 243 of the stitching via 240 in order to prevent the metal plates 230-1 and 230-2 to be electrically connected to the metal layer 210.

The two adjacent metals 230-1 and 230-2 may not be connected on the same planar surface in the electromagnetic bandgap structure of FIG. 2A. Instead, the two adjacent metals 230-1 and 230-2 can be connected to each other through another planar surface (i.e. the same planar surface as the metal layer 210) by the stitching via 240. Accordingly, the electromagnetic bandgap structure 200 having the stitching via 240 of FIG. 2A can more easily acquire an inductance component with a longer length than that of connecting the adjacent metal plates to each other on the same planar surface under the same conditions. In addition, since the adjacent metal plates of the present invention are connected to each other by the stitching via 240, it is unnecessary to form an additional pattern for electrically connecting the metal plates placed on a second layer. This can make a spaced distance between the metal plates narrower. Accordingly, it can be possible to increase the capacitance component formed between the adjacent metal plates.

Described below is the principle by which the structure shown in FIG. 2A can function as the electromagnetic bandgap structure blocking a signal of a certain frequency band. The dielectric layer 220 can be interposed between the metal layer 210 and the metal plates 230-1 and 230-2. This may cause a capacitance component to be formed between the metal layer 210 and the metal plates 230-1 and 230-2 and between the two adjacent metal plates. Also, there may be an inductance component connecting through the first via 241→the connection pattern 243→the second via 242 between the two adjacent metal plates by the stitching via 240. At this time, the value of the capacitance component can vary according to various factors such as the spaced distances between the metal layer 210 and the metal plates 230-1 and 230-2 and between the two adjacent metal plates, the dielectric constant of a dielectric material forming the dielectric layer 220 and the size, shape and area of the metal plate. Also, the value of the inductance component can vary according to various factors such as the shape, length, depth, width and area of the first via 241, a second via 242 and the connection pattern 243. Accordingly, adjusting and designing various aforementioned factors adequately can make it possible to allow the structure of FIG. 2A to function as the electromagnetic bandgap structure (i.e. a band stop filter) for removing or blocking a certain noise or a certain signal of an object frequency band. This can be easily understood through the equivalent circuit of FIG. 2C.

Figure 2C:
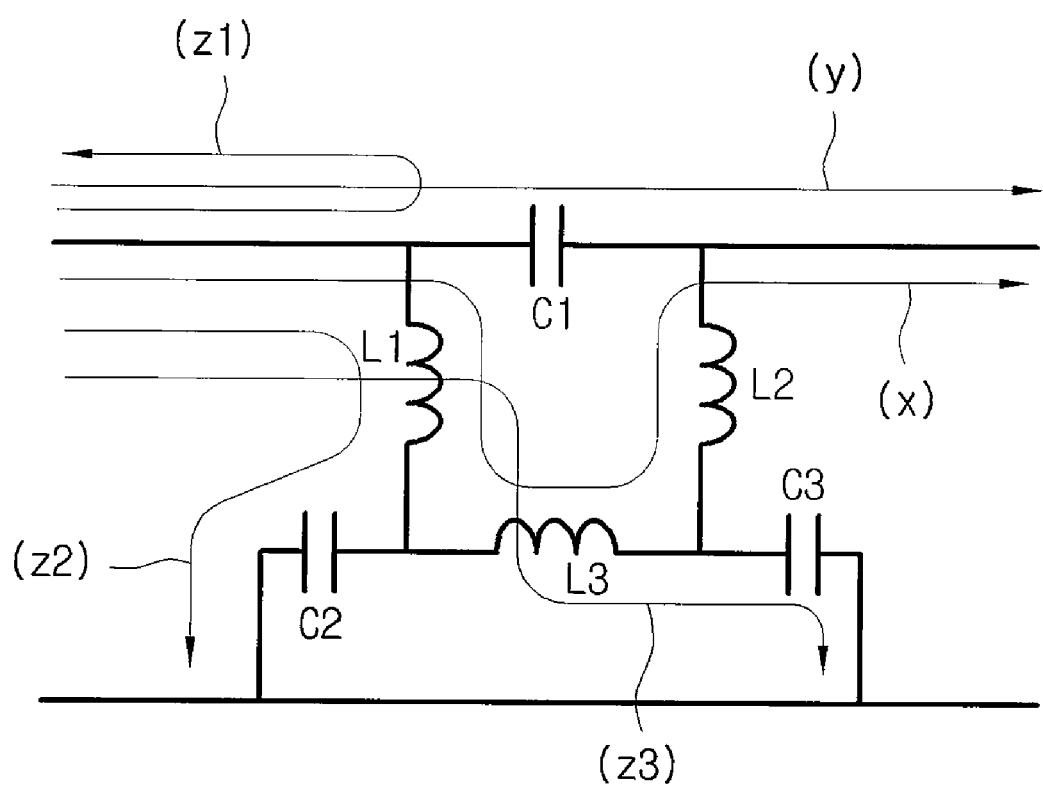
FIG. 2C shows an equivalent circuit of the electromagnetic bandgap structure shown in FIG. 2A.

Comparing the equivalent circuit of FIG. 2C with the electromagnetic bandgap structure of FIG. 2A, an inductance component L1 can correspond to the first via 241, and an inductance component L2 can correspond to the second via 242. An inductance component L3 can correspond to the connection pattern 243. C1 can be a capacitance component by the metal plates 230-1 and 230-2 and another dielectric layer and another metal layer to be placed above the metal plates 230-1 and 230-2. C2 and C3 can be capacitance components by the metal layer 210 placed on the same planar surface as the connection pattern 243 and another dielectric layer and another metal layer to be placed below the planar surface of the connection pattern 243.

The electromagnetic bandgap structure shown in FIG. 2A can function as a band stop filter, which blocks a signal of a certain frequency band according to the above equivalent circuit. In other words, as seen in the equivalent circuit of FIG. 2C, a signal x of a low frequency band (refer to FIG. 2C) and a signal y of a high frequency band (refer to FIG. 2C) can pass through the electromagnetic bandgap structure, and signals z1, z2 and z3 of a certain frequency band (refer to FIG. 2C) ranging between the low frequency band and the high frequency band are blocked by the electromagnetic bandgap structure.

Accordingly, if the structure of FIG. 2A is repeatedly arranged on a whole part (refer to FIG. 3A, FIG. 3B, FIG. 3C and FIG. 3D) or a part (refer to FIG. 3E) of an inner surface of the printed circuit board (the same can be applied to the structure of FIG. 4 in accordance with an embodiment of the present invention described below) as a noise transferable path, it is possible to function as the electromagnetic bandgap structure that can prevent a signal of a certain frequency band from being transferred.

The identical or similar idea can be applied to the electromagnetic bandgap structure of FIG. 2B.

The electromagnetic bandgap structure of FIG. 2B has no metal layer corresponding to the reference numeral 210 as compared with the electromagnetic bandgap structure of FIG. 2A.

If there is a metal layer on the same planar surface to correspond to an area on which the connection pattern 243 will be formed, the connection pattern 243 can be manufactured in the form of being accommodated in the clearance hale 250 formed in the metal layer 210 on the same planar surface as shown in FIG. 2A. However, no additional metal layer may be placed in the area in which the connection pattern 243 will be formed, as shown in FIG. 2B. Of course, there may be the dielectric layer 220 below the metal plates in FIG. 2B.

Although not shown in the accompanying drawings, it may not be always necessary that the 2-layered electromagnetic bandgap structure including the stitching via is formed to have a stacked structural form in which the metal plates 230-1 and 230-2 are stacked in the dielectric layer 220 and the dielectric layer 220 is stacked in the metal layer 210. The 2-layered electromagnetic bandgap structure including the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural form, with the position of the upper layer and the lower layer inversed from that of FIG. 2A).

Of course, this case can be expected to have the identical or similar noise blocking effect described above.

Hereinafter, the electromagnetic bandgap structure in accordance with an embodiment of the present invention will be described in detail with reference to FIG. 4 and FIG. 5. Below descriptions focus on the difference from the aforementioned electromagnetic bandgap structure, and the description of the content that can be duplicated or be equally applied as described above as shown in FIG. 2A through FIG. 3E will be omitted.

FIG. 4 is a 3-D perspective view showing an electromagnetic bandgap structure having a single-via structure in accordance with an embodiment of the present invention. FIG. 5 is a 3-D sectional view showing the electromagnetic bandgap structure of the present invention according to the A-B line of FIG. 4.

With reference to FIG. 4, an electromagnetic bandgap structure in accordance with an embodiment of the present invention includes a metal layer 410, a dielectric layer 420, a plurality of metal plates 430, a via 440 connected to each of the metal plates 430, and a metal trace 450. At this time, the metal layer 410 can be omitted, similar to FIG. 2B. Since the electromagnetic bandgap structure of FIG. 4 is placed inside a printed circuit board, another dielectric layers 422 and 424 can be placed above the metal plates 430, and/or other metal plates 460 and 470 can be placed below the metal layer 410.

Although the electromagnetic bandgap structure shown in FIG. 4 has a structure similar to the electromagnetic bandgap structure shown in FIG. 2A, the electromagnetic bandgap structure shown in FIG. 4 has each via 440 for the metal plates 430 and the vias are electrically connected to each other through the metal trace 450, respectively, which will be described with reference to FIG. 5.

For the convenience of description, only two metal plates 430-1 and 430-2 shown in FIG. 5 are referred to as a first metal plate and a second metal plate, and each of two vias connected to the two metal plates 440-1 and 440-2 are referred to as a first single via and a second single via.

As shown in FIG. 5, the first single via 440-1 is formed as having one end part 440a-1 connected to the first metal plate 430-1 and penetrating the dielectric layer 420, and the second single via 440-2 is formed as having one end part 440a-2 connected to the second metal plate 430-2 and penetrating the dielectric layer 420. At this time, the other end part 440b-1 of the first single via 440-1 and the other end part 440b-2 of the second single via 440-2 are electrically connected to each other. Although a new landless type is developed, since a vialand is generally formed in two end parts of the via to solve the error problem of the via processing, the parts connected to the metal trace 450 can be the vialands 441-1 and 441-2 formed in each other end part of the first single via 440-1 and the second single via 440-2.

In other words, all metal plates 430 can be formed as a closed loop by designing to connect the other end part of the single via connected to any one metal plate of the plurality metal plates 430 and the other end part of each single via connected to the plates adjacent to the any one plate through the metal trace in the electromagnetic bandgap structure in accordance with an embodiment of the present invention.

At this time, if the metal layer 410 that needs to be electrically separated from the metal plates 430 is placed on the same planar surface as the position in which the other end part of the via 440 and the metal trace 450 will be formed as shown in FIG. 4 and FIG. 5, a clearance hole 445 can be formed corresponding to the position in which the other end part of the via 440 and the metal trace 450 are to be formed as described above.

As such, if it has only one via 440 for every metal plate 430 and the vias 440 are electrically connected to each other through the metal trace 450, respectively, some effects that are more advantageous than FIG. 2A can be acquired as clearly seen in FIG. 6A through FIG. 7B.

Figure 6A:
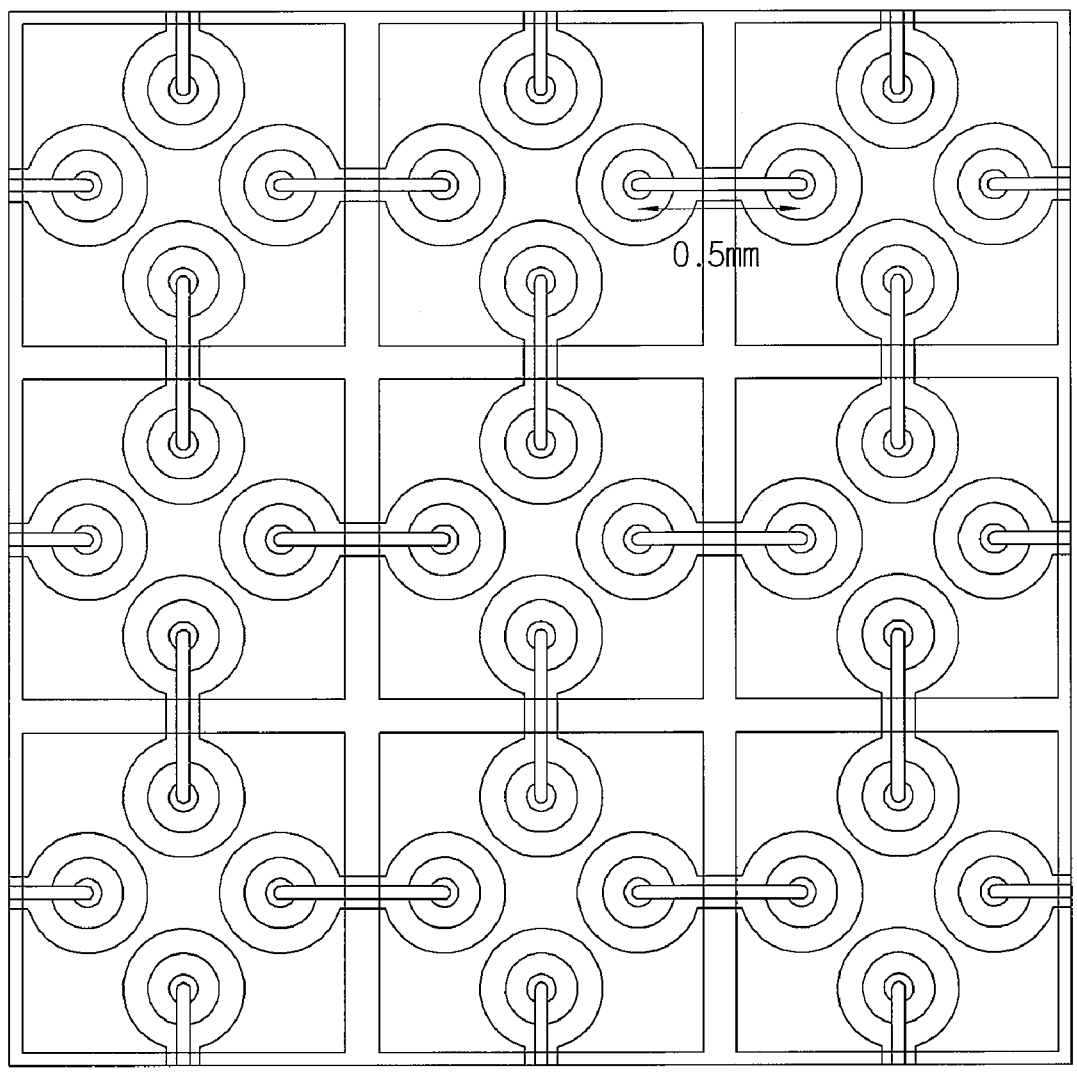
FIG. 6A and FIG. 6B show the length of a connection pattern and the space utilization in the electromagnetic bandgap structure shown in FIG. 2A.
Figure 6B:
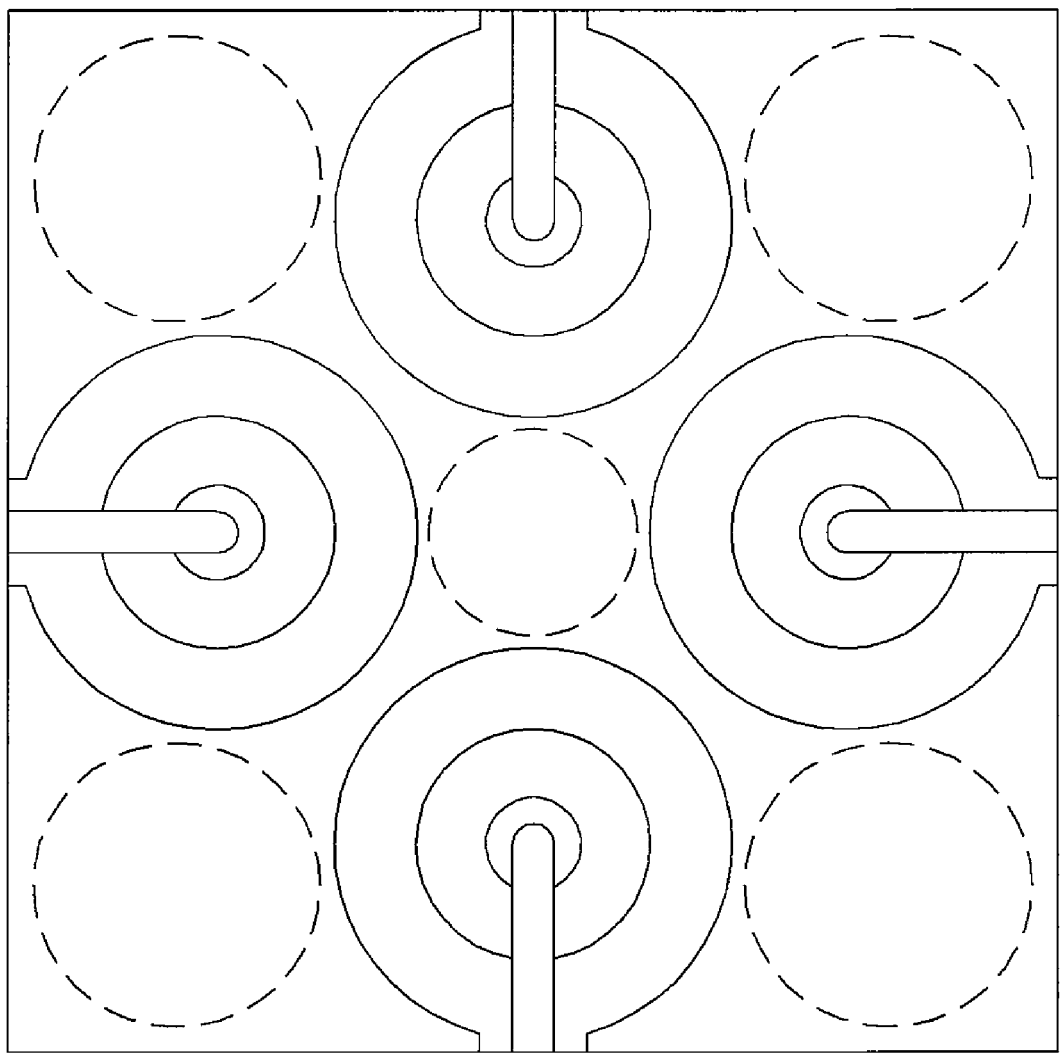

In the case of the electromagnetic bandgap structure shown in FIG. 2A, since two adjacent metal plates are connected to each other through each one of the stitching via, the vias connected to the metal plate are plural (four in FIG. 6A and FIG. 6B). Because of this, the length of the connection pattern connecting two adjacent vias becomes short and the space utilization of the metal plate also decreases as shown in FIG. 6B.

As such, the limit of acquiring the length of the connection pattern means that it is not easy to acquire a sufficient inductance value, and the decrease of the space utilization of the metal plate means the decrease of the design freedom and flexibility (for example, the limit to decrease the metal plate size).

Figure 7A:
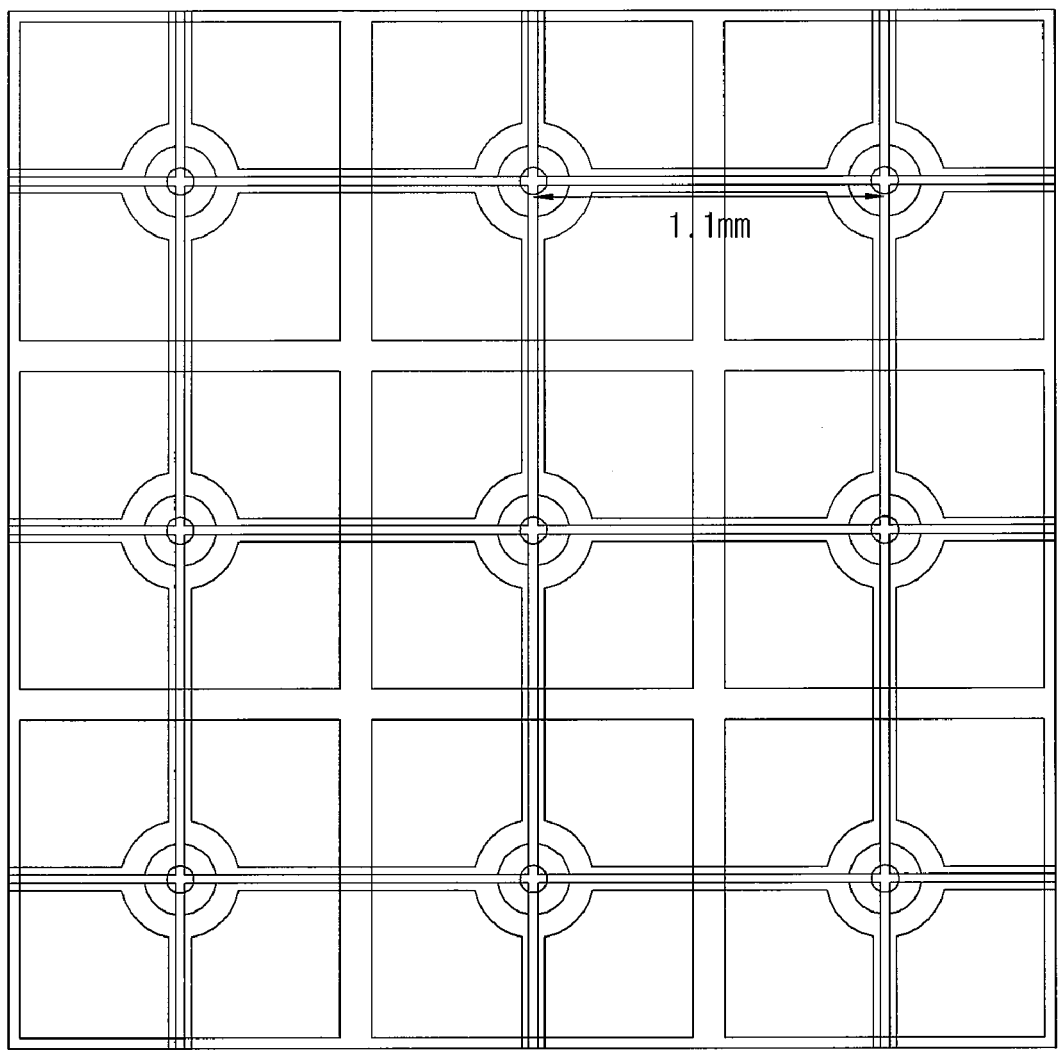
FIG. 7A and FIG. 7B show the length of a conductive trace and the space utilization in the electromagnetic bandgap structure shown in FIG. 4.
Figure 7B:
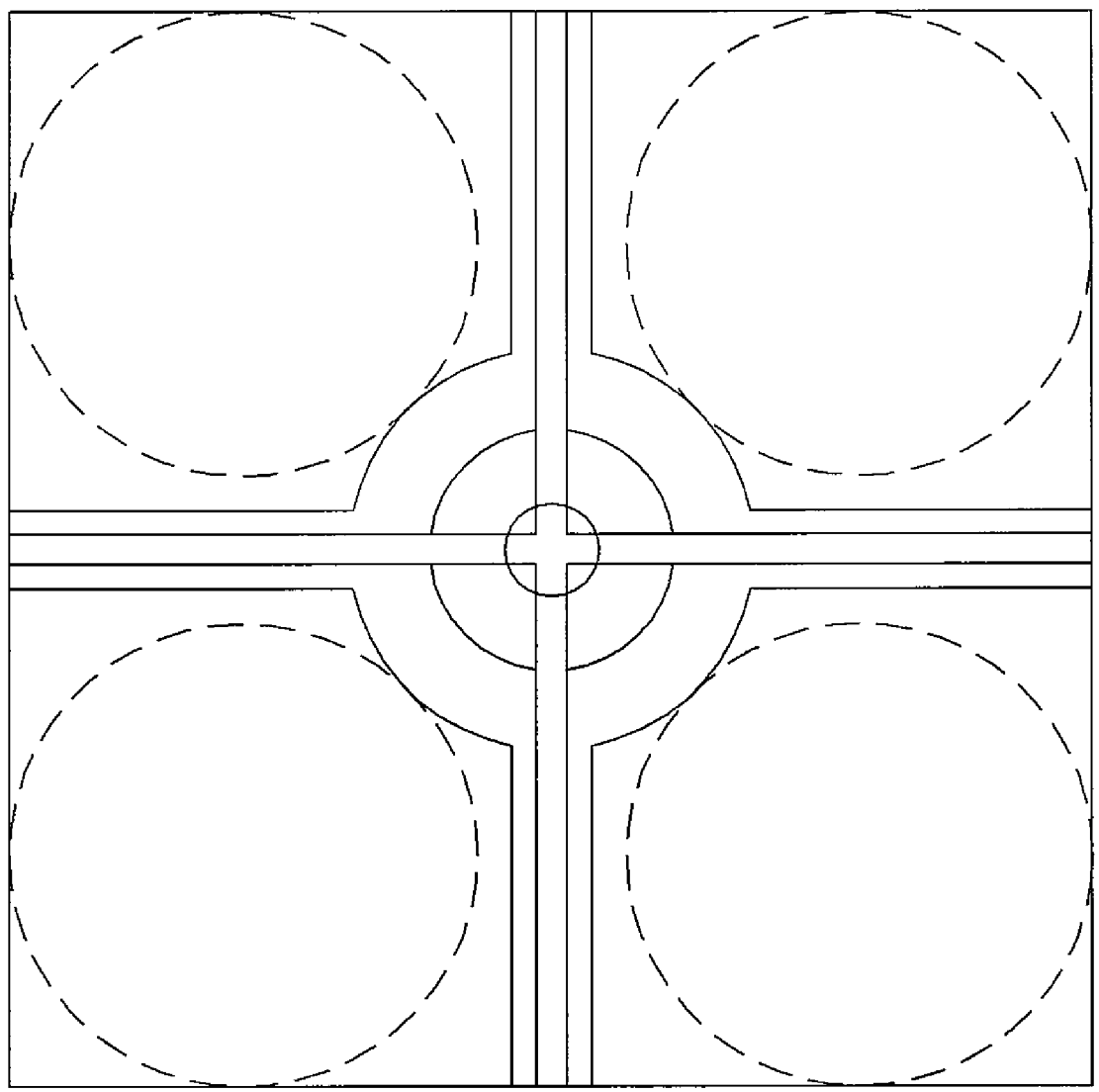

In comparison, since every metal plate is connected to only one single via in the electromagnetic bandgap structure shown in FIG. 4 and FIG. 5, the the design freedom and flexibility can increase because of the increase of the space utilization of the metal plate, as shown in FIG. 7B. In addition, since the spaced distance between the single vias increases in relation to the aforementioned reason in the electromagnetic bandgap structure of the present invention, it is possible to acquire a larger inductance value because of the increase of the length of the metal trace as shown in FIG. 7A.

Besides, since the number of vias which will be processed decreases in comparison with FIG. 2A, not only the entire product processing is simpler, but it is also possible to reduce the manufacturing cost and time.

In order to maximize the advantages as described above, each single via connected to each metal plate can be formed in the position corresponding to the face-center of the metal plate. Of course, various methods for acquiring a long length of the metal trace can be substituted for the forming in the position of the face-center.

Although the metal trace connecting between any two single vias has a straight line form in all accompanying drawings, the metal trace can be manufactured as a line form broken one or more times (for example, a broken zigzag line form). In this case, since it is possible to acquire longer length of the metal trace than a distance in a straight line between the single vias, a larger inductance component can be acquired.

Because of the aforementioned advantages, the bandgap frequency in accordance with the electromagnetic bandgap structure of the present invention moves to a lower frequency than that of FIG. 2A under the same design condition (i.e. the same metal plate size, same via length, same dielectric material, etc.). This can be obviously seen in FIG. 8.

FIG. 8 shows a simulation result analyzed by use of scattering parameters in order to check whether an electromagnetic bandgap structure having a single via structure provided by the present invention has the band blocking property of a certain frequency band.

Here, the reference numeral 30 indicates the frequency property of the electromagnetic bandgap structure of the 2-layered structure that includes the stitching via as shown in FIG. 2A. The reference numeral 40 indicates the frequency property of the electromagnetic bandgap structure including the single via as shown in FIG. 4.

With reference to FIG. 8, while the electromagnetic bandgap structure of FIG. 2A has the bandgap frequency band formed above about 11 GHz on a blocking rate of −50 dB basis, it can be recognized that the electromagnetic bandgap structure shown in FIG. 4 has the bandgap frequency band formed from about 7.2 GHz on the same blocking rate (i.e. −50 dB) basis. In other words, it can be seen that the electromagnetic bandgap structure shown in FIG. 4 has the bandgap frequency band lowered by about 3.8 GHz as compared with the electromagnetic bandgap structure of FIG. 2A. Also, its noise level (i.e. a blocking rate) is seen to be lower.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. A printed circuit board in which an electromagnetic bandgap structure is disposed in an area of a noise transferable path between a noise source point and a noise blocking destination point of the printed circuit board, the electromagnetic bandgap structure comprising:

a dielectric layer;

a plurality of conductive plates placed on a planar surface which is different from that of the dielectric layer;

vias, each of the vias being connected to each of the conductive plates and penetrating through the dielectric layer from one end part that is connected to the conductive plates;

a conductive trace connecting the other end parts of the vias with each other such that all of the conductive plates are electrically connected; and a conductive layer interposed between the conductive plates and the dielectric layer, wherein the other end part of the via and the conductive trace are accommodated in a clearance hole formed in the conductive layer such that each of the conductive plates and the conductive layer can be electrically separated from each other, wherein the conductive layer is one of a ground layer and a power layer, and the conductive plates are electrically connected to the other of the ground layer and the power layer.

2. The printed circuit board of claim 1, wherein the other end part of the via that is connected to any one of the plurality of conductive plates is electrically connected to the other end part of each of the vias connected to the conductive plates adjacently placed around any one of the conductive plates through the conductive trace.

3. The printed circuit board of claim 1, wherein the via is formed at a position corresponding to a face-center of the conductive plate.

4. The printed circuit board of claim 1, wherein the conductive trace has a straight-line form or a line form broken one or more times.

5. A printed circuit board in which an electromagnetic bandgap structure is disposed in an area of a noise transferable path between a noise source point and a noise blocking destination point of the printed circuit board, the electromagnetic bandgap structure comprising:

a dielectric layer;

a plurality of conductive slates placed on a planar surface which is different from that of the dielectric layer;

vias, each of the vias being connected to each of the conductive plates and penetrating through the dielectric layer from one end part that is connected to the conductive plates:, a conductive trace connecting the other end parts of the vias with each other such that all of the conductive plates are electrically connected; and a conductive layer interposed between the conductive plates and the dielectric layer, wherein the other end part of the via and the conductive trace are accommodated in a clearance hole formed in the conductive layer such that each of the conductive plates and the conductive layer can be electrically separated from each other, wherein the conductive layer is a ground layer, and the conductive plates are electrically connected to a signal layer.

6. A printed circuit board in which an electromagnetic bandgap structure is disposed in an area of a noise transferable path between a noise source point and a noise blocking destination point of the printed circuit board, the electromagnetic bandgap structure comprising: a dielectric layer; a plurality of conductive plates placed on a planar surface which is different from that of the dielectric layer; vias, each of the vias being connected to each of the conductive plates and penetrating through the dielectric layer from one end part that is connected to the conductive plates; and a conductive trace connecting the other end parts of the vias with each other such that all of the conductive plates are electrically connected and a conductive layer interposed between the conductive plates and the dielectric layer, wherein the other end part of the via and the conductive trace are accommodated in a clearance hole formed in the conductive layer such that each of the conductive plates and the conductive layers can be electrically separated from each other wherein the two electronic circuit having different operation frequencies are installed in the printed circuit board, and the noise source point and the noise blocking destination point correspond to one position and the other position, respectively , in which the electronic circuit are to be installed.

* * * * *